United States Patent [19]

Uehara et al.

[11] Patent Number: 5,217,848
[45] Date of Patent: Jun. 8, 1993

[54] METHOD AND APPARATUS FOR PROCESSING PRESENSITIZED LITHOGRAPHIC PRINTING PLATE

[75] Inventors: Masafumi Uehara, Shin; Kazuhiro Shimura, Oume; Shinya Watanabe, Hachioji, all of Japan

[73] Assignee: Konica Corporation, Tokyo, Japan

[21] Appl. No.: 783,117

[22] Filed: Oct. 25, 1991

[30] Foreign Application Priority Data

Oct. 29, 1990 [JP] Japan .................................. 2-291134

[51] Int. Cl.⁵ .................... G03F 7/32; G03D 3/00; G03D 3/12
[52] U.S. Cl. .................................. 430/309; 430/302; 430/331; 101/463.1; 354/298; 354/317; 354/320; 354/322; 354/324; 354/325
[58] Field of Search .............. 430/309, 302, 332; 101/463.1; 354/298, 324, 320, 322, 317, 325, 319, 321

[56] References Cited

U.S. PATENT DOCUMENTS

| | | | |
|---|---|---|---|
| 4,537,496 | 8/1985 | Ohba et al. | 430/300 |
| 4,963,473 | 10/1990 | Nakano et al. | 430/309 |
| 5,089,839 | 2/1992 | Nakano et al. | 430/309 |
| 5,106,724 | 4/1992 | Nogami et al. | 430/309 |

FOREIGN PATENT DOCUMENTS

| | | |
|---|---|---|
| 0084097A3 | 7/1983 | European Pat. Off. . |
| 0247835A3 | 12/1987 | European Pat. Off. . |
| 0423782A2 | 4/1991 | European Pat. Off. . |
| 62-23044 | 1/1987 | Japan .................................. 430/302 |
| 62-78558 | 4/1987 | Japan .................................. 354/315 |
| 3-91750 | 4/1991 | Japan .................................. 430/302 |

OTHER PUBLICATIONS

European Search Report dated Oct. 6, 1992 for EP Application Number EP 91 30 9953.
Patent Abstracts of Japan, vol. 11, No. 216 (P-595) Jul. 14, 1987 for JP-A-62 035 363.
Patent Abstracts of Japan, vol. 11, No. 219 (P-596) Jul 16, 1987 for JP-A-62 036 673.

Primary Examiner—Cynthia Hamilton
Assistant Examiner—Janis L. Dote
Attorney, Agent, or Firm—Finnegan, Henderson, Farabow, Garrett & Dunner

[57] ABSTRACT

Disclosed are a method and an apparatus for processing with a developing solution repeatedly used, both an imagewise exposed, positive-working presensitized lithographic printing plate and an imagewise exposed negative-working presensitized lithographic printing plate. The plates each comprise an aluminum support and a light-sensitive layer formed thereon. A replenishing solution is added to the developing solution to compensate for the degradation of the developing solution brought about by development and/or by carbon dioxide in the air. The method comprises the steps of; measuring a reflection density of the light-sensitive layer of the printing plates to discriminate the type of the printing plate, selecting a predetermined developing condition according to the discriminated type of the printing plate, and developing the printing plates according to the selected developing condition.

11 Claims, 2 Drawing Sheets

METHOD AND APPARATUS FOR PROCESSING PRESENSITIZED LITHOGRAPHIC PRINTING PLATE

FIELD OF THE INVENTION

The present invention relates to a method of, and an apparatus for, processing a presensitized lithographic printing plate. More particularly, it relates to a method and an apparatus that are suited for processing a positive-working presensitized lithographic printing plate and a negative-working presensitized lithographic printing plate in common.

BACKGROUND OF THE INVENTION

Hithertofore, in instances in which positive-working presensitized lithographic printing plates and negative-working presensitized lithographic printing plates are processed using a developing solution capable of developing a negative-working presensitized lithographic printing plate and a positive-working presensitized lithographic printing plate in common, there is a processing method in which a fresh developing solution is fed to the surfaces of the plates to be processed and the developing solution having been used is discarded (i.e, a fresh-solution processing method). In another processing method in which a replenishing solution is added to a developing solution so that the developing solution can be repeatedly used (i.e., a circulation method), positive-working presensitized lithographic printing plates and negative-working presensitized lithographic printing plates may cause exhaustion of the developing solution in a degree different from each other, and hence there has been the problem that it is difficult to control the replenishing and is difficult to carry out stable processing in practical use. The fresh-solution processing method has the disadvantage that it consumes the developing solution in a larger quantity than the circulation method.

SUMMARY OF THE INVENTION

An object of the present invention is to provide a method of, and an apparatus for, processing a presensitized lithographic printing plate, that can stably process both a positive-working presensitized lithographic printing plate and a negative-working presensitized lithographic printing plate in common in a set of automatic processor, using at least one developing solution which is repeatedly used.

Another object of the present invention is to provide a technique capable of achieving a processing cost reduction, in a method of, and an apparatus for, processing a presensitized lithographic printing plate, that can stably process a positive-working presensitized lithographic printing plate and a negative-working presensitized lithographic printing plate in common in a set of automatic processor, using at least one developing solution which is repeatedly used.

The above objects of the present invention can be achieved by a processing method and a processing apparatus as summarized below.

(1) A method for processing both an imagewise exposed, positive-working presensitized lithographic printing plate and an imagewise exposed, negative-working presensitized lithographic printing plate, comprising developing the printing plates with a developing solution repeatedly used, the printing plates comprising an aluminum support and a light-sensitive layer formed thereon, a replenishing solution being added to the developing solution to compensate for the degradation of the developing solution brought about by development and/or by carbon dioxide in the air, comprising the steps of;

measuring a reflection density of the light-sensitive layer of the printing plates to discriminate the type of the printing plate:

selecting a predetermined developing condition according to the discriminated type of the printing plate; and developing the printing plates according to the selected developing condition.

(2) An apparatus for processing both an imagewise exposed, positive-working presensitized lithographic printing plate and an imagewise exposed, negative-working presensitized lithographic printing plate, comprising developing the printing plates with a developing solution repeatedly used, the printing plates comprising an aluminum support and a light-sensitive layer formed thereon, comprising;

means for adding a replenishing solution to the developing solution to compensate for the degradation of the developing solution brought about by development and/or by carbon dioxide in the air;

means for measuring a reflection density of the light-sensitive layer of the printing plates:

means for discriminating the type of the printing plate;

means for selecting a predetermined developing condition according to the discriminated type of the printing plate; and means for changing a developing condition of the printing plates automatically according to the selected developing condition.

DETAILED DESCRIPTION OF THE INVENTION

The present invention will be described below with reference to accompanying drawings.

Figure 1:
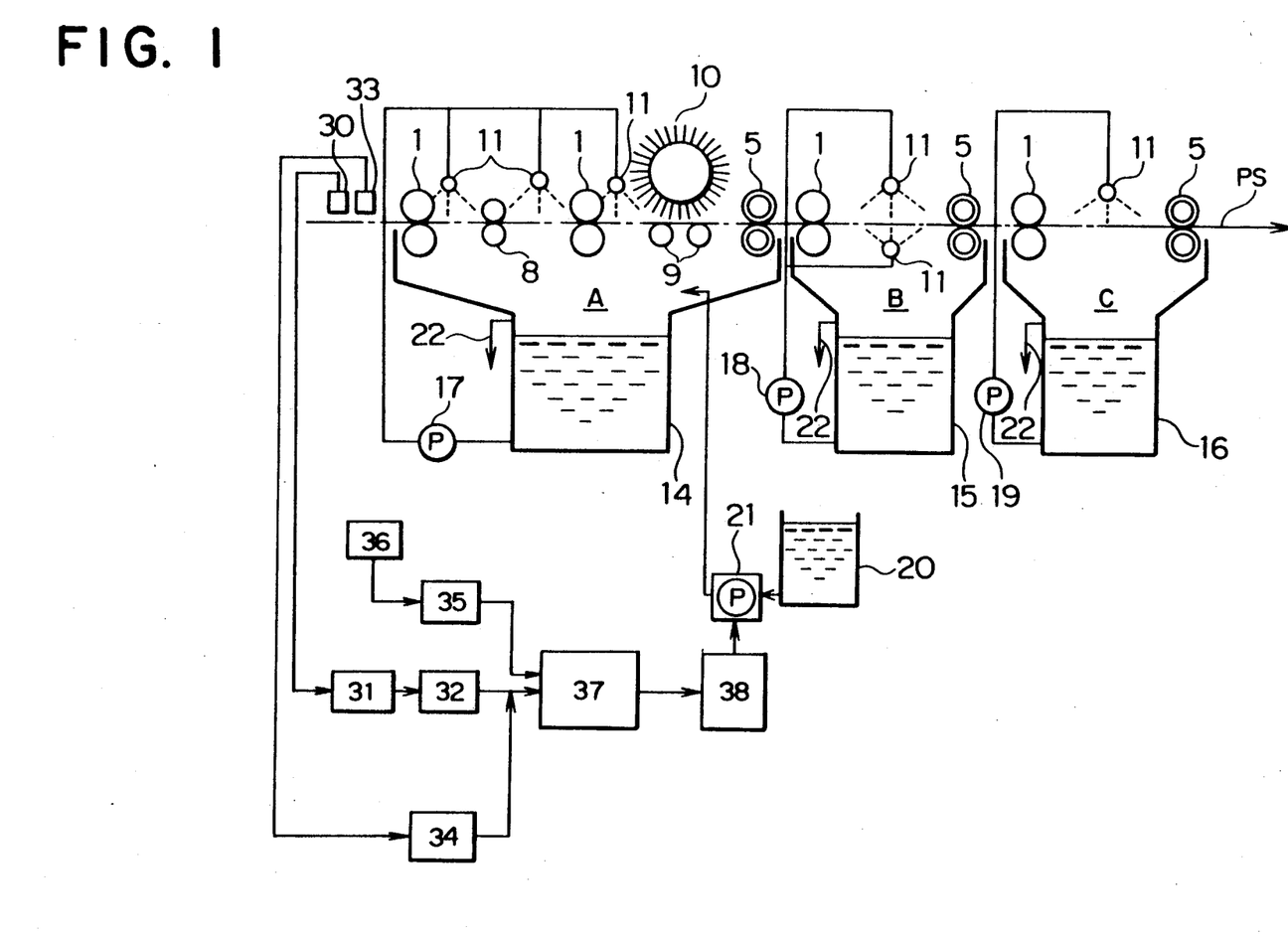
FIGS. 1 and 2 diagrammatically illustrate embodiments of processing apparatus according to the present invention.

FIG. 1 diagrammatically illustrates an embodiment of the processing apparatus according to the present invention. In FIG. 1, the letter symbol A denotes a developing zone in which developing is carried out using a repeatedly usable developing solution capable of developing a negative-working presensitized lithographic printing plate and a positive-working presensitized lithographic printing plate in common (hereinafter "negative/positive common developing solution"), B, a washing zone in which presensitized lithographic printing plates are washed with water; C, a rinsing/gum zone in which presensitized lithographic printing plates are processed with a rinsing solution or a gum solution; and PS, a path through which the presensitized lithographic printing plates are transported.

In these processing zones, reference numeral 1 denotes a pair of transport rollers for transporting presensitized lithographic printing plates; 5, a pair of squeegee rollers; 8, a pair of skewer-shaped rollers; 9, a guide roller; 10, a brush roller that brushes plate surfaces to accelerate development; II, a shower pipe; 14, a developing solution tank that holds a developing solution; 15, a washing water tank that holds washing water; 16, a rinsing/gum solution tank that hold a rinsing solution or a desensitizing solution (a gum solution); 17, 18 and 19, pumps that feed processing solutions from the developing solution tank 14, the washing water tank 15 and the rinsing/gum solution tank 16 to each corresponding shower pipe 11; 20, a developer replenishing solution tank that holds a replenishing solution to compensate for the degradation of a developing solution brought about by development and/or by carbon dioxide in the air; and 21, a replenishing device, comprising a liquid-feed metering pump and having a mechanism of operating a buzzer according to the results of detection with a sensor capable of detecting whether the replenishing solution in the developer replenishing solution tank 20 is short or empty. The liquid-feed metering pump is so designed as to be operated through a control system comprised of a feed control circuit 37 described later, and also be manually operated. Reference numeral 22 denotes a pipe that guides an overflow from the developing solution tank 14, the washing water tank 15 or the rinsing/gum solution tank 16 to each corresponding overflow tank (not shown). Reference numeral 30 denotes a planimetric reflection sensor, measuring the width of a presensitized printing plated and the time taken for transport, comprising a plurality of optical sensors arranged at regular intervals in a horizontal direction falling at right angles with the transport path, where a light-emitting device irradiates the surface of a presensitized lithographic printing plate transported there and a receptor receives the light reflected from the surface of the presensitized lithographic printing plate. Reference numeral 31 denotes a plate width detecting circuit, which is so designed that the plate width can be detected on the basis of plate detection signals sent from the planimetric reflection sensor 30. Reference numeral 32 denotes a plate area integrating circuit, which is so designed that a plate area to be processed can be detected by integration of the signals from the planimetric reflection sensor 30.

Reference numeral 33 denotes a discriminating sensor, which is so constituted that a reflection density or a reflectance of the light-sensitive layer of the exposed presensitized lithographic printing plate is measured before development so as to discriminate the type of the printing plate. The type of the exposed presensitized lithographic printing plates means a negative-working presensitized lithographic printing plate or a positive-working presensitized lithographic printing plate. It is preferably so constituted that differences in reflection density of photosensitive layers at an exposed portion (non-image portion) of the positive-working presensitized lithographic printing plate and an unexposed portion (non-image portion) of the negative-working presensitized lithographic printing plate can be measured to discriminate the difference in type between the positive type and the negative type. The light used in discriminating the difference in type is preferably light having a wavelength of from 350 nm to 450 nm or from 550 nm to 650 nm, and more preferably light having a wavelength of from 360 nm to 430 nm or from 550 nm to 620 nm. Reference numeral 34 denotes a negative/positive discriminating circuit, which is so constructed that the reflection density with respect to light of a specific wavelength is measured with the discriminating reflection sensor 33 and the measurements obtained are compared with a predetermined standard value to discriminate the positive and negative types.

As the light-emitting device that emits light having a wavelength within the above wavelength region, preferably used in discriminating the difference in type, any devices can be used so long as they are light sources that emit light having a wavelength within the above wavelength region. For example, a tungsten lamp or a sodium ($D_2$) lamp can be preferably used. The light from a light source may also be passed through a spectroscopic system such as a grating spectroscope, or an interference filter, to take out a monochromatic light to shed the light upon the plate surfaces. A photodiode, a phototransistor or the like is used as the receptor.

Reference numeral 35 denotes an operation/pause-time integrating circuit, which controls replenishment in accordance with an exhaustion of a developing solution (processing exhaustion) resulting from the processing of presensitized lithographic printing plates, as well as degradation of a developing solution (exhaustion with time) caused by carbon dioxide in the air. It detects operation or pause of the processing apparatus according to the on-off of a power source switch 36 of the processing apparatus, and integrates respectively the operation time and the pause time to calculate the amount of replenishment that corresponds to the exhaustion with time in each state of operation or pause.

The apparatus is so constructed that the above plate areas, positive/negative discriminating signals and signals corresponding to the amount of exhaustion with time are inputted to a flow-rate control circuit 37, and the replenishing device 21 is controlled via a pump driving circuit 38 so that the developing solution can be replenished in the amount based on the predetermined function relationship. A known technique can be applied in respect of the controlling of developing conditions corresponding with the plate areas, the positive/negative discriminated types and the exhaustion with time at the time of operation or pause.

Operation of the apparatus will be described below with reference to FIG. 1.

First, presensitized lithographic printing plates are inserted from the left end, viewed in the drawing, of the transport path PS. Then the plate area is calculated by means of the plate width detecting circuit 31 and the plate area integrating circuit 32 on the basis of the signals detected by the planimetric reflection sensor 30, and separately the positive type or negative type is identified by the negative/positive discriminating circuit 34 on the basis of the signals detected by the discriminating reflection sensor 33. These signals are inputted to the flow-rate control circuit 37. In parallel with these, the signals from the operation/pause-time integrating circuit 35 are inputted to the flow-rate control circuit 37. The flow-rate control circuit 37 controls the replenishing device 21 in such a way that the developing solution is replenished in the amount based on the predetermined function relationship having been set up using the plate areas, the positive/negative discriminated types and the signals from the operation/pause-time integrating circuit 35 as variables, so that the developer replenishing solution held in the replenishing solution tank 20 is supplied to the developing tank 14. The timing of this replenishment may be appropriately selected. For example, at the time a presensitized lithographic printing plate is inserted, the replenishment is carried out wherein the amount of replenishment is changed according to the plate area and the type of the printing plate and before the presensitized lithographic printing plate is inserted the replenishment is carried out which corresponds with the exhaustion with time.

In the developing zone A, the negative/positive common developing solution held in the developing solution tank 14 for which the above replenishment is carried out is fed by means of the pump 17 to the plate surface, the plate surface is brushed with the brush roller 10, and then any developing solution adhered to the both sides of the plate and any matters dissolved out on the photosensitive layer of the presensitized lithographic printing plate are removed by a pair of squeegee rollers 5. Developing is thus completed.

Next, the presensitized lithographic printing plate is transported to the washing zone B. In the washing zone B, the washing water held in the washing water tank 15 is fed from the shower pipe 11 to the plate surface of the presensitized lithographic printing plate by means of the pump 18. The presensitized lithographic printing plate having been washed is passed through the squeegee rollers 5, where the solution remaining on the both surfaces thereof are removed. Subsequently, the presensitized lithographic printing plate is transported to the rinsing/gum zone C. In this zone, a rinsing solution or gum solution held in the rinsing/gum solution tank 16 is fed from the shower pipe 11 to the plate surface by means of the pump 19, and then removed by the squeegee rollers 5, leaving the solution in the necessary amount. Thus the processing is completed.

Figure 2:
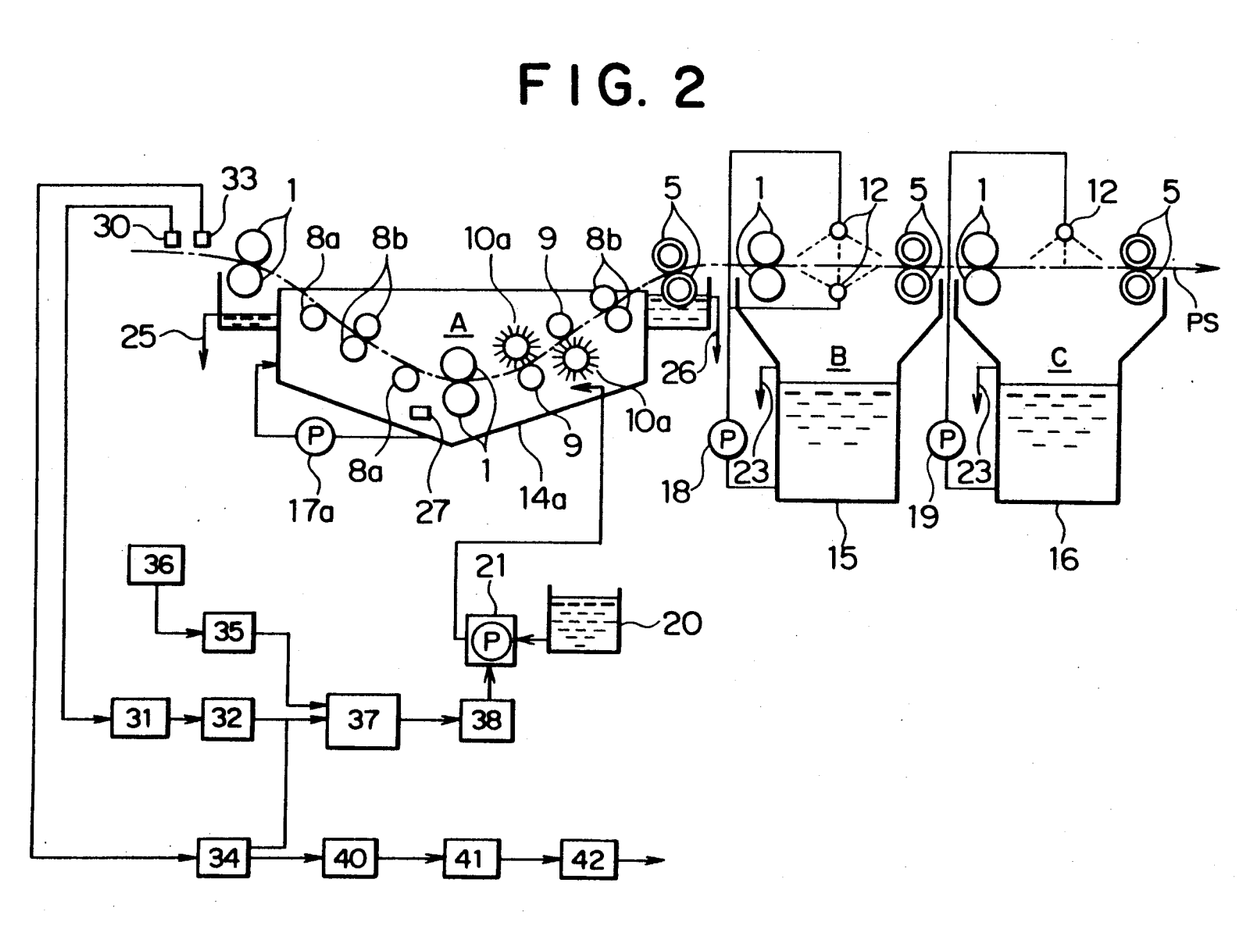

FIG. 2 diagrammatically illustrates another embodiment of the processing apparatus according to the present invention. In FIG. 2, the letter symbol A denotes a developing zone in which developing is carried out using a repeatedly usable negative/positive common developing solution, B, a washing zone; C, a rinsing-/gum zone in which presensitized lithographic printing plates are processed with a rinsing solution or a gum solution; and PS, a path through which the presensitized lithographic printing plates are transported.

In these processing zones, reference numeral 1 denotes a pair of transport rollers for transporting presensitized lithographic printing plates; 5, a pair of squeegee rollers; 8a, a skewer-shaped roller; 8b, a pair of skewer-shaped rollers; 9, a guide roller; 10a, a brush roller; 12, a shower pipe; 14a, a developing solution tank; 15, a washing water tank; 16, a rinsing/gum solution tank that hold a rinsing solution or a desensitizing solution (a gum solution); 17a, a pump that causes the developing solution in the developing solution tank 14a to flow; 18 and 19, pumps that pressure-feed processing solutions to each corresponding shower pipe 12; 20, a developer replenishing solution tank that holds a developer replenishing solution; 21, a replenishing device; 23, 25 and 26, each a pipe that guides an overflow to an overflow tank (not shown); and 27, a heater with a thermostat, for heating the developing solution in the developing solution tank 14a to maintain it at a given temperature. Reference numeral 30 denotes a planimetric reflection sensor; 31, a plate width detecting circuit; 32, a plate area integrating circuit; 33, a discriminating reflection sensor; 34, a negative/positive discriminating circuit: 35, an operation/pause-time integrating circuit: 36, a power source switch; 37, a flow-rate control circuit; and 38, a pump driving circuit. The construction and function of these are the same as those in the apparatus shown in FIG. 1. Reference numeral 40 denotes a transport speed control circuit, which is so designed that the speed at which presensitized lithographic printing plates are transported can be changed according to the input from the negative/positive discriminating circuit 34. Reference numeral 41 denotes a drive circuit for rotationally driving each roller provided along the transport path PS and 42, a motor that rotationally drives each roller.

Operation of the apparatus will be described below with reference to FIG. 2.

First, presensitized lithographic printing plates are inserted from the left end, viewed in the drawing, of the transport path PS. Then, in the same way as in the apparatus shown in FIG. 1, the plate area is calculated by means of the plate width detecting circuit 31 and the plate area integrating circuit 32 on the basis of the signals detected by the planimetric reflection sensor 30, and separately the type of the printing plate is identified by the negative/positive discriminating circuit 34 on the basis of the signals detected by the discriminating reflection sensor 33. These signals are inputted to the flow-rate control circuit 37. In parallel with these, the signals from the operation/pause-time integrating circuit 35 are inputted to the flow-rate control circuit 37. The flow-rate control circuit 37 controls the replenishing device 21 in such a way that the developing solution is replenished in the amount based on the predetermined function relationship having been set up using the plate areas, the positive/negative discriminated types and the signals from the operation/pause-time integrating circuit 35 as variables, so that the developer replenishing solution held in the replenishing solution tank 20 is supplied to the developing solution tank 14a. The signals from the negative/positive discriminating circuit 34 are processed in the transport speed control circuit 40 to generate signals that indicate a transport speed for each of the positive-working presensitized lithographic printing plate and the negative-working presensitized lithographic printing plate. The roller drive circuit is controlled according to this signals so that the transport speed can be changed according to the discriminated difference in type between the positive plate and negative plate.

In the developing zone A, the presensitized lithographic printing plate is immersed in the negative/positive common developing solution held in the developing solution tank 14a for which the above replenishment is carried out, the plate surface is brushed with the brush roller 10a, and then any developing solution adhered to the both sides of the plate and any matters dissolved out on the photosensitive layer of the presensitized lithographic printing plate are removed by the pair of squeegee rollers 5. Developing is thus completed.

Next, the presensitized lithographic printing plate is transported to the washing zone B and then to the rinsing/gum zone C, where the washing and its post processing are carried out in the same manner as in the apparatus shown in FIG. 1.

Developing conditions that are automatically changed according to the automatically discriminated difference in type between the positive-working presensitized lithographic printing plate and the negative-working presensitized lithographic printing plate may be arbitrarily selected, and a known technique can be applied. Such conditions may also be determined by an experimental means.

For example, in an instance in which one sort of developer replenishing solution is used and the amount of replenishment is changed according to the discriminated positive-working presensitized lithographic printing plate or negative-working presensitized lithographic printing plate, the amount of the replenishment is determined as described below. A fresh developing solution is used and positive-working presensitized lithographic printing plates are continuously processed in a large number to experimentally determine a total plate area (Ap) of the plates processed until the developing solution has been exhausted to a tolerance limit of sensitivity variations and an amount of replenishment (proper amount of replenishment) (Rp) necessary for the sensitivity at that time to be restored to the sensitivity of the fresh solution. Separately, negative-working presensitized lithographic printing plates are processed to similarly determine a total plate area (An) of the plates processed until the developing solution has been exhausted to a tolerance limit of sensitivity variations and a proper amount of replenishment (Rn) for the exhausted solution. Using the results obtained above, the amount of replenishment per plate area of the plates processed is expressed by Rp/Ap in the case of the positive-working presensitized lithographic printing plate, and Rn/An in the case of the negative-working presensitized lithographic printing plate.

In an instance in which, besides the amount of replenishment, the transport speed, i.e., developing time, is selected as the amount to be controlled, an experiment similar to the above may be carried out on a plurality of standard transport speeds, and the conditions under which best results have been obtained maybe employed.

As other means, it is also possible to employ a known technique relating to the technique of controlling developing conditions such as developing temperatures and brushing conditions for the processing of positive-working presensitized lithographic printing plates and negative-working presensitized lithographic printing plates.

The presensitized lithographic printing plate to which the present invention can be applied may include those comprising a support having a hydrophilic surface, provided on this surface with a layer of a photosensitive composition as shown below.

1) Photosensitive composition containing diazo compound:

The diazo compound contained in this photosensitive composition may include diazo resins as typified by, for example, a condensate of an aromatic diazonium salt with formaldehyde or acetaldehyde. It may include, for example, a diazo resin which is a salt of a condensate of p-diazodiphenylamine with formaldehyde or acetaldehyde, e.g., a hexafluoroborophosphate, tetrafluoroborophosphate, perchlorate or periodate of the above condensate; and a diazo resin organic salt which is a reaction product of the above condensate and a sulfonate, as disclosed in U.S. Pat. No. 3,300,309. It may also include compositions in which a diazo resin is used in combination with a binder. Various polymeric compounds can be used as the binder, including a copolymer of a monomer having an aromatic hydroxyl group as disclosed in Japanese Patent Publication Open to Public Inspection (hereinafter referred to as Japanese Patent O.P.I. Publication) No. 98613/1979; polymers of, e.g., N-(4-hydroxyphenyl)acrylamide, N-(4-hydroxyphenyl) methcrylamide, o-, m- or p-hydroxystyrene or o-, m- or p-hydroxyphenyl methacrylate and other monomer; polymers containing a hydroxyethyl acrylate unit or hydroxyethyl methacrylate unit as a main repeating unit, as disclosed in U.S. Pat. No. 4,123,726; natural resins such as shellac and rosin; polyvinyl alcohol; polyamide resins as disclosed in U.S. Pat. No. 3,751,257; linear polyurethane resins as disclosed in U.S. Pat. No. 3,660,097; phthalated resin of polyvinyl alcohol; epoxy resins obtained by condensation from bisphenol-A and epichlorohydrin; and cellulose derivatives such as cellulose acetate and cellulose acetate phthalate. In a preferred embodiment, the negative-working presensitized lithographic printing plate comprises a support and, provided thereon, a light-sensitive layer comprising a diazo resin.

2) Photosensitive composition containing o-quinonediazide compound:

A photosensitive composition containing an o-quinonediazide compound may include compositions in which an o-quinonediazide compound and an alkali-soluble resin are used in combination. In a preferred embodiment, the positive-working presensitized lithographic printing plate comprises a support and, provided thereon, a light-sensitive layer comprising o-naphthoquinonediazide.

The o-quinonediazide compound may include an ester compound of, e.g., o-naphthoquinonediazidosulfonic acid with a polycondensation resin of a phenol with an aldehyde or a ketone.

The above phenol may include, for example, monohydric phenols such as phenol, o-cresol, m-cresol, p-cresol, 3,5-xylenol, carvacrol and thymol; dihydric phenols such as catechol, resorcinol and hydroquinone; and trihydric phenols such as pyrogallol and phloroglucinol. The above aldehyde may include formaldehyde, benzaldehyde, acetaldehyde, crotonaldehyde and furfural. The above ketone may include acetone and methyl ethyl ketone.

The above polycondensation resin may specifically include phenol/formaldehyde resin, m-cresol/formaldehyde resin, m-, p-mixed cresol/formaldehyde resin, resorcinol/benzaldehyde resin, and pyrogallol/acetone resin.

The above o-naphthoquinonediazide compound may include those in which the rate of condensation of o-naphthoquinonediazidosulfonic acid with respect to the OH group of a phenol (a conversion per one OH group) is 15% to 80%.

The o-quinonediazide compound that can be used may also include those disclosed in Japanese Patent O.P.I. Publication No. 43451/1983.

The support may include paper, plastic-laminated paper as exemplified by polyethylene-, polypropylene- or polystyrene-laminated paper, sheets of metals such as aluminum (including aluminum alloys), zinc and copper, films of plastics such as cellulose diacetate, cellulose triacetate, cellulose propionate, polyethylene terephthalate, polyethylene, polypropylene, polycarbonate and polyvinyl acetal, and paper to or on which any of the metals described above is laminated or deposited, or steel sheets coated with chromium. Of these, an aluminum support and a composite support covered with aluminum are particularly preferred.

The support may also include those comprising an aluminum material having been subjected to surface roughening for the purpose of improving water retension and also improving adhesion to a photosensitive layer. The surface roughening may be carried out by a conventionally known method such as brushing, ball etching, electrolytic etching, chemical etching, liquid honing or sand blasting, and a combination of any of these.

At least one repeatedly usable developing solution used in the present invention is preferably an alkaline developing solution comprised of water as a main solvent (stated specifically, comprised of 50% by weight or more of water) which is a negative/positive common developing solution. This developing solution and a replenishing solution therefor may each preferably be an alkaline water-based developing solution with pH 10 or more, and preferably pH 12 or more, containing an alkali silicate and also containing at least one of an organic solvent and a surface active agent.

The alkali silicate may include, for example, potassium silicate, sodium silicate, sodium metasilicate, potassium metasilicate and ammonium silicate. The alkali silicate may preferably be contained in the developing solution in an amount ranging from 0.3 to 10% by weight. The alkali silicate may be in an amount ranging from 0.1 to 7.0% by weight in terms of $SiO_2$ concentration.

In the developing solution and developer replenishing solution used in this invention, an alkali agent other than the alkali silicate can be used in combination. For example, an inorganic alkali agent such as potassium hydroxide, sodium hydroxide, lithium hydroxide, sodium tertiary phosphate, sodium secondary phosphate, potassium tertiary phosphate, potassium secondary phosphate, ammonium tertiary phosphate, ammonium secondary phosphate, sodium metasilicate, sodium bicarbonate, sodium carbonate, potassium carbonate or ammonium carbonate, and an organic alkali agent such as mono-, di- or triethanolamine or a tetraalkyl hydroxide can be used in combination.

An organic solvent or a surface active agent is preferably added to the developing solution and the replenishing solution used in the present invention.

The organic solvent may preferably be those having a solubility to water at 20° C., of not less than 10% by weight, including, for example, carboxylic acid esters such as ethyl acetate, propyl acetate, butyl acetate, benzyl acetate, ethylene glycol monobutylacetate, butyl lactate and butyl levulinate; ketones such as ethyl butyl ketone, methyl isobutyl ketone and cyclohexanone; alcohols such as ethylene glycol monobutyl ether, ethylene glycol benzyl ether, ethylene glycol monophenyl ether, benzyl alcohol, methylphenylcarbinol, n-amyl alcohol and methylamino-alcohol; alkyl-substituted aromatic hydrocarbons such as xylene; and halogenated hydrocarbons such as methylene dichloride, ethylene dichloride and monochlorobenzene. These organic solvents may each be used alone or in combination of two or more kinds.

The surface active agent that can be used may be at least one selected from a nonionic surface active agent, an anionic surface active agent, a cationic surface active agent and an amphoteric surface active agent. It may preferably be a nonionic surface active agent.

The nonionic surface active agent can be roughly grouped into polyethylene glycol types and polyhydric alcohol types, both of which can be used. From the viewpoint of development performance, nonionic surface active agents of a polyethylene glycol type are preferred, among which more preferred is a nonionic surface active agent having three or more ethylene oxy groups and also having an ULB value (HLV is the abbreviation for hydrophile-lipophile balance) of not less than 5, and more preferably from 8 to 20.

Of the nonionic surface-active agents, those having both an ethylene oxy group and a propylene oxy group are particularly preferred, among which those having an HLB value of not less than 8 are more preferred.

Preferred examples of the nonionic surface active agent include the compounds represented by the following Formulas (1) to (8).

In Formulas (1) to (8), R represents a hydrogen atom or a monovalent organic group. Such an organic group may include, for example, a straight-chain or branched alkyl group having 1 to 30 carbon atoms which may have a substituent as exemplified by an aryl group such as phenyl, an alkylcarbonyl group in which the alkyl moiety is the same as the above alkyl group, and a phenyl group which may have a substituent as exemplified by a hydroxyl group and the same alkyl group as the above. The letter symbols a, b, c, m, n, x and y each represent an integer of 1 to 40.

Examples of the nonionic surface active agent are shown below.

Polyethylene glycol, polyoxyethylene lauryl ether, polyoxyethylene nonyl ether, polyoxyethylene cetyl ether, polyoxyethylene stearyl ether, polyoxyethylene oleyl ether, polyoxyethylene behenyl ether, polyoxyethylene polyoxypropylene cetyl ether, polyoxyethylene polyoxypropylene behenyl ether, polyoxyethylene nonyl phenyl ether, polyoxyethylene octyl phenyl ether, polyoxyethylene stearylamine, polyoxyethylene oleylamine, polyoxyethylene stearic acid amide, polyoxyethylene oleic acid amide, polyoxyethylene castor oil, polyoxyethylene abietyl ether, polyoxyethylene lanolin ether, polyoxyethylene monolaurate, polyoxyethylene monostearate, polyoxyethylene glyceryl monooleate, polyoxyethylene glyceryl monostearate, polyoxyethylene propylene glycol monostearate, an oxyethylene oxypropylene block polymer, a distyratedphenol polyethylene oxide adduct, a tribenzylphenol polyethylene oxide adduct, an octylphenol polyoxyethylene polyoxypropylene adduct, glycerol monostearate, sorbitan monolaurate, polyoxyethylene sorbitan monolaurate, etc.

The nonionic surface active agent may preferably have a weight average molecular weight ranging from 300 to 10,000, and particularly preferably from 500 to 5,000.

The anionic surface active agent may include higher alcohol ($C_8$ to $C_{22}$) sulfuric acid ester salts as exemplified by a sodium salt of lauryl alcohol sulfate, a sodium salt of octyl alcohol sulfate, an ammonium salt of lauryl alcohol sulfate, Teepol-81 (trade name; available from Shell Kagaku K.K.) and a disodium alkylsulfate, aliphatic alcohol phosphoric acid ester salts as exemplified by a sodium salt of cetyl alcohol phosphoric acid ester, alkylaryl sulfonic acid salts as exemplified by a sodium salt of dodecylbenzenesulfonic acid, a sodium salt of isopropylnaphthalenesulfonic acid, a sodium salt of dinaphthalenedisulfonic acid and a sodium salt of metanitrobenzenesulfonic acid, sulfonates of alkylamides as exemplified by $C_{17}H_{33}CON(CH_3)CH_2SO_3Na$, and sulfonates of dibasic fatty acid esters as exemplified by dioctyl sodium sulfosuccinate and dihexyl sodium sulfosuccinate In particular, the sulfonates are preferably used.

The cationic surface active agent can be roughly grouped into amine types and quaternary ammonium salt types, both of which can be used.

Examples of the amine types are a polyoxyethylene alkylamine, a N-alkylpopyleneamine, a N-alkylpolyethylene polyamine, a N-alkylpolyethylene polyamine dimethyl sulfate, an alkylbiguanide, a long-chain amine oxide, an alkylimidazoline, a 1-hydroxyethyl-2-alkylimidazoline, a 1-acetylaminoethyl-2-alkylimidazoline and a 2-alkyl-4-methyl-4-hydroxymethyloxazoline.

Examples of the quaternary ammonium salt types are a long-chain primary amine salt, an alkyltrimethylammonium salt, a dialkyldimethylethylammonium salt, an alkyldimethylammonium salt, an alkyldimethylbenzylammonium salt, an alkylpyridinium salt, an alkylquinolinium salt, an alkyl isoquinolinium salt, an alkylpyridinium sulfate, a stearamidomethylpyridinium salt, an acylaminoethyl diethylamine salt, an acylaminoethyl methyldiethylammonium salt, an alkylamidopropyl dimethylbenzylammonium salt, a fatty acid polyethylene polyamide, an acylaminoethylpyridinium salt, an acylcolaminoformylmethylpyridinium salt, a stearoxymethylpyridinium salt, a fatty acid triethanolamine, a fatty acid triethanolamine formate, a trioxyethylene fatty acid triethanolamine, a fatty acid dibutylaminoethanol, a cetyloxymethylpyridinium salt and a p-isooctylphenoxyethoxyethyl dimethylbenzylammonium salt. In the above, "alkyl" represents a straight-chain or partially substituted alkyl having 6 to 20 carbon atoms, where, stated specifically, straight-chain alkyls such as hexyl, octyl, cetyl and stearyl are preferably used.

In particular, cationic surface active agents of a water-soluble quaternary ammonium type are effective, among which preferred are an alkyltrimethylammonium salt, an alkyldimethylbenzylammonium salt, an ethylene oxide addition ammonium salt and so forth. Polymers having a cationic component as a repeating unit can also be grouped into a cationic surface active agent in a broad sense, and are included in the cationic surface active agent of this invention. In particular, a polymer containing a quaternary ammonium salt, obtained by copolymerization with a lipophilic monomer, can preferably be used.

Such a polymer may have a weight average molecular weight ranging from 300 to 50,000, and particularly preferably from 500 to 5,000.

As the amphoteric surface active agent, it is possible to use a compound as exemplified by sodium N-methyl-N-pentadecylaminoacetate.

These surface active agents may each preferably be contained in the developing solution in an amount ranging from 0.5 to 10% by weight.

Besides the above, an inorganic reducing agent, an organic reducing agent or an organic carboxylic acid may be added to the negative/positive common developing solution and the replenishing solution used in the present invention.

The inorganic reducing agent may include, for example, sulfites such as sodium sulfite, potassium sulfite, ammonium sulfite, sodium hydrogensulfite and potassium hydrogensulfite; phosphites such as sodium phosphite, potassium phosphite, sodium hydrogenphosphite, potassium hydrogenphosphite, sodium dihydrogenphosphite and dipotassium hydrogenphosphite; hydrazine, sodium thiosulfate and sodium dithiosulfite. Reducing agents that can bring about a particularly superior effect are sulfites. These sulfites may be contained in an amount ranging from 0.1% by weight to 10% by weight, and preferably from 0.5% by weight to 5% by weight.

The developing solution and the replenishing solution therefor may also contain other known additives as exemplified by a water-soluble or alkali-soluble organic reducing agent, an organic carboxylic acid and salts thereof.

The organic reducing agent may include, for example, phenolic compounds such as hydroquinone, methol and methoxyquinone, and amine compounds such as phenylenediamine and phenylhydrazine.

The organic carboxylic acid may include aliphatic carboxylic acids having 6 to 20 carbon atoms, and aromatic carboxylic acids comprising a benzene ring or naphthalene ring on which a carboxylic group is substituted.

The aliphatic carboxylic acids may preferably be alkanoic acids having 6 to 20 carbon atoms, specifically including caproic acid, enanthylic acid, caprylic acid, pelargonic acid, capric acid, lauric acid, myristic acid, palmitic acid and stearic acid. Alkanoic acids having 6 to 12 carbon atoms are particularly preferred. Fatty acids having a double bond in the carbon chain or those having a branched carbon chain are also available. The above aliphatic carboxylic acids may be used in the form of sodium or potassium salts or ammonium salts.

Specific compounds of the aromatic carboxylic acids may include benzoic acid, o-chlorobenzoic acid, p-chlorobenzoic acid, o-hydroxybenzoic acid, p-hydroxybenzoic acid, p-t-butylbenzoic acid, o-aminobenzoic acid, p-aminobenzoic acid, 2,4-dihydroxybenzoic acid, 2,5-dihydroxybenzoic acid, 2,3-dihydroxybenzoic acid, 3,5-dihydroxybenzoic acid, gallic acid, 1-hydroxy-2-naphthoic acid, 3-hydroxy-2-naphthoic acid, 2-hydroxy-1-naphthoic acid, 1-naphthoic acid and 2-naphthoic acid.

The above aromatic carboxylic acids may be used in the form of sodium or potassium salts or ammonium salts.

The aliphatic carboxylic acid or aromatic carboxylic acid may be contained in an amount of 0.1% by weight to 10% by weight.

In the developing solution and developer replenishing solution used in this invention, the following additives may be added to the above components so that development performance can be improved. They include, for example, neutral salts such as NaCl, KCl and KBr, as disclosed in Japanese Patent O.P.I. Publication No. 75152/1983; chelating agents such as EDTA and NTA, as disclosed in Japanese Patent O.P.I. Publication No. 190952/1984; complexes such as [Co(NH$_3$)]$_6$Cl$_3$, as disclosed in Japanese Patent O.P.I. Publication No. 121336/1984; polymeric ampholytes such as a copolymer of vinylbenzyl trimethylammonium chloride with sodium acrylate, as disclosed in Japanese Patent O.P.I. Publication No. 142528/1981; inorganic lithium compounds such as lithium chloride, as disclosed in Japanese Patent O.P.I. Publication No. 59444/1983; organic lithium compounds such as lithium benzoate, as disclosed in Japanese Patent Examined Publication No. 34442/1975; organic metal surface active agents containing Si, Ti or the like, as disclosed in Japanese Patent O.P.I. Publication No. 75255/1984; and organic boron compounds as disclosed in Japanese Patent O.P.I. Publication No. 84241/1984.

The negative/positive common developing solution used in the method of the present invention may also include the developing solutions as disclosed in Japanese Patent O.P.I. publications No. 24263/1987, No. 24264/1987, No. 25761/1987, No. 35351/1987, No. 75535/1987, No. 89060/1987, No. 125357/1987, No. 133460/1987, No. 159148/1987, No. 168160/1987, No. 175758/1987, No. 200154/1988 and No. 205658/1988.

The replenishing solution added to the repeatedly usable developing solution may preferably be supplied for both the processing exhaustion and the exhaustion with time. In carrying out the replenishment for the processing exhaustion, it is preferable to detect the area of the non-image portion and to detect the length of a presensitized lithographic printing plate in the direction of its transport, and also preferable to change between the positive-working presensitized lithographic printing plate and the negative-working presensitized lithographic printing plate the coefficient of the amount of replenishment, calculated from the above information. It is still also preferable to determine the coefficient of the amount of replenishment by combining the results of discriminated differences in type between the positive-working presensitized lithographic printing plate and the negative-working presensitized lithographic printing plate and the results of detection of both the processing exhaustion and the exhaustion with time.

The reflection density of the surface of a photosensitive layer, which is measured for the purpose of discriminating the difference in type, may be measured at any part of a presensitized lithographic printing plate. It may preferably be measured at a position within 5 cm from the edge of a presensitized lithographic printing plate, and more preferably at a position within 4 cm from the front edge or rear edge in the transport direction of a presensitized lithographic printing plate. This is because the above part corresponds to the exposed portion in the case of the negative-working presensitized lithographic printing plate and to the unexposed portion in the case of the negative-working presensitized lithographic printing plate and hence is preferable for the measurement of reflection density on the surface of the photosensitive layer at its exposed portion in the case of the positive-working presensitized lithographic printing plate and at its unexposed portion in the case of the negative-working presensitized lithographic printing plate.

EXAMPLES

This invention will be described below by giving Examples. In the following, "part(s)" indicates "parts by weight".

Example 1

The following developing solution (24 liters) was put in the developing solution tank 14 of the automatic processor as shown in FIG. 1, and the following developer replenishing solution, in the developer replenishing solution tank 20.

| Developing solution: | |
|---|---|
| β-Anilinoethanol | 0.3 part |
| Propylene glycol | 0.3 part |
| 2-Hydroxy-3-naphthoic acid | 0.6 part |
| p-tert-Butyl benzoic acid | 1.2 parts |
| Emulgen 147 | 0.05 part |
| (trade name; a nonionic surface active agent, available from Kao Corporation) | |
| Aqueous potassium silicate solution (SiO$_2$ content: 26% by weight; K$_2$O content: 13% by weight) | 2.2 parts |
| Potassium hydroxide | 1.5 parts |
| Potassium sulfite | 0.9 part |
| Water | 90 parts |
| Developer replenishing solution: | |
| β-Anilinoethanol | 0.3 part |
| Propylene glycol | 0.6 part |
| 2-Hydroxy-3-naphthoic acid | 0.6 part |
| p-tert-Butyl benzoic acid | 1.5 parts |
| Emulgen 147 | 0.55 part |
| Potassium silicate | 6.0 parts |
| Potassium hydroxide | 3.1 parts |
| Potassium sulfite | 1.8 parts |
| Water | 82 parts |

Preparation of positive-working presensitized lithographic printing plate:

A JIS-1050 aluminum plate of 0.24 mm in thickness was immersed in an aqueous 2% sodium hydroxide solution to carry out degreasing. Thereafter, the plate was roughened by an electrochemical means in a diluted nitric acid solution, and then thoroughly cleaned, which was thereafter subjected to anodizing in a diluted sulfuric acid solution. An oxide coating of 2.5 g/m$^2$ was thus formed on the surface of the above aluminum plate. The aluminum plate thus treated was washed with water, and dried. Thereafter, a photosensitive solution having the following composition was coated thereon so as to give a dry weight of 2.5 g/m$^2$, and dried to give a positive-working presensitized lithographic printing plate plate.

| Composition of photosensitive coating solution: | |
|---|---|
| Ester compound of naphthoquinone-(1,2)-diazido-(2)-5-sulfonic acid chloride with pyrogallol/acetone resin (the compound disclosed in Synthesis Example 2 in Japanese Patent O.P.I. Publication No. 143345/1985) | 2 parts |
| Copolycondensation resin of phenol, m-, p-mixed cresol with formaldehyde (when synthesized, phenol, m-cresol and p-cresol were charged in molar ratio of 20:48:32; weight average molecular weight Mw: 7,400; number average molecular weight Mn: 1,400) | 6.5 parts |
| Ester compound of novolak resin synthesized from p-tert-octylphenol and formaldehyde, with naphthoquinone-(1,2)-diazido-(2)-5-sulfonic acid chloride (rate of esterification: 50 mol %; Mw: 1,700) | 0.1 part |

-continued

| Composition of photosensitive coating solution: | |
|---|---|
| Victoria Pure Blue BOH (trade name; available from Hodogaya Chemical Co., Ltd.) | 0.08 part |
| Ethyl cellosolve | 80 parts |
| Methyl cellosolve | 20 parts |

The positive-working presensitized lithographic printing plate thus obtained was made ready for use in a large number, brought into close contact with a transparent positive film and a sensitivity-measuring step tablet (No. 2, available from Eastman Kodak Co.; a gray scale with 21 stages having each density difference of 0.15), and then exposed to light for 60 seconds with a distance of 70 cm under conditions of 8.0 mW/cm$^2$, using a 2 kW metal halide lamp (trade name: Idolfin 2000; manufactured by Iwasaki Electric Co., Ltd.) as a light source.

Preparation of negative-working presensitized lithographic printing plate:

A JIS-1050 aluminum plate of 0.24 mm in thickness was immersed in an aqueous 20% sodium phosphate solution to carry out degreasing. Thereafter, the plate was roughened by an electrochemical means in a diluted hydrochloric acid solution, and then thoroughly cleaned, which was thereafter subjected to anodizing in a diluted sulfuric acid solution. An oxide coating of 1.5 g/m$^2$ was thus formed on the surface of the above aluminum plate. The aluminum plate thus treated was further immersed in an aqueous sodium metasilicate solution to carry out sealing of the anodic oxide coating, then washed with water, and dried. Thereafter, a photosensitive solution having the following composition was coated thereon so as to give a dry weight of 2.0 g/m$^2$, and dried to give a negative-working presensitized lithographic printing plate.

| Composition of photosensitive solution: | |
|---|---|
| Hexafluorophosphate of condensate of p-diazidodiphenylamine with paraformaldehyde | 1 part |
| N-(4-hydroxylphenyl)methacrylamide copolymer (the compound disclosed in Example 1 in Japanese Patent Publication No. 43890/1982) | 10 parts |
| Victoria Pure Blue BOH (trade name; a dye, available from Hodogaya Chemical Co., Ltd.) | 0.2 part |
| Ethylene glycol monomethyl ether | 100 parts |

The negative-working presensitized lithographic printing plate thus obtained was made ready for use in a large number, brought into close contact with a transparent positive film and a sensitivity-measuring step tablet (No. 2, available from Eastman Kodak Co.; a gray scale with 21 stages having each density difference of 0.15), and then exposed to light for 30 seconds with a distance of 70 cm under conditions of 8.0 mW/cm$^2$, using a 2 kW metal halide lamp (trade name: Idolfin 2000; manufactured by Iwasaki Electric Co., Ltd.) as a light source.

The detection conducted by means of the discriminating reflection sensor 33 was so set as to be carried out 2 seconds after the detection by means of the planimetric reflection sensor 30 was conducted. Using light having a wavelength of 410 nm, the reflection density of the positive-working presensitized lithographic printing plate was measured at its exposed portion, and that of the negative-working presensitized lithographic printing plate at its unexposed portion. When the reflection density was less than 0.7, a plate was identified as the positive-working presensitized lithographic printing plate, and when it was 0.7 or more, identified as the negative-working presensitized lithographic printing plate.

Replenishing conditions with respect to processing plate area for each type of the plates were set as follows:

| Replenishment for processing exhaustion: | |
|---|---|
| Positive-working presensitized lithographic printing plate: | 60 ml/m$^2$ |
| Negative-working presensitized lithographic printing plate: | 42 ml/m$^2$ |
| (Coefficient of the amount of replenishment: 1.0 for positive type, 0.7 for negative type) | |
| Replenishment for exhaustion with time: | |
| Operation time of automatic processor: | 200 ml/hr |
| Pause time of automatic processor: | 50 ml/hr |

Under the above conditions, 100 plates of the positive-working presensitized lithographic printing plate and 100 plates of the negative-working presensitized lithographic printing plate were processed at random. As a result, good prints were obtained even on the 200th plate.

Example 2

Using the same developing solution, developer replenishing solution and presensitized lithographic printing plates as in Example 1, the following experiment was carried out by the use of the processing apparatus as shown in FIG. 2.

The developing solution (24 liters) was put in the developing solution tank 14a. Temperature of the developing solution was maintained at 30° C., and developing time was set to 12 seconds for the positive-working presensitized lithographic printing plate and 20 seconds for the negative-working presensitized lithographic printing plate.

The detection conducted by means of the discriminating reflection sensor 33 was so set as to be carried out 1 second after the detection by means of the planimetric reflection sensor 30 was conducted. Using light having a wavelength of 430 nm in for the discriminating of the difference in type, the reflection density of the positive-working presensitized lithographic printing plate was measured at its exposed portion, and that of the negative-working presensitized lithographic printing plate at its unexposed portion. When the reflection density was less than 0.65, a plate was identified as the positive-working presensitized lithographic printing plate, and when it was 0.65 or more, identified as the negative-working presensitized lithographic printing plate.

Replenishing conditions with respect to processing plate area for each type of the plates were set as follows:

| Replenishment for processing exhaustion: | |
|---|---|
| Positive-working presensitized lithographic printing plate: | 60 ml/m$^2$ |
| Negative-working presensitized lithographic printing plate: | 42 ml/m$^2$ |
| (Coefficient of the amount of replenishment: 1.0 for positive type, 0.7 for | |

| -continued | |
|---|---|
| negative type) | |
| The developing solution was replenished in an amount of 300 ml for each replenishment. | |
| Replenishment for exhaustion with time: | |
| Operation time of automatic processor: | 120 ml/hr |
| Pause time of automatic processor: | 35 ml/hr |

Under the above conditions, 100 plates of the positive-working presensitized lithographic printing plate and 100 plates of the negative-working presensitized lithographic printing plate were processed at random. As a result, good prints were obtained even on the 200th plate.

Comparative Example

An experiment was carried out in the same manner as in Example 1 except that the discriminating reflection sensor 33 was removed and the replenishment for processing exhaustion was carried out in an amount of 51 ml/m$^2$ each for both a negative-working presensitized lithographic printing plate and a positive-working presensitized lithographic printing plate. As a result, faulty development occurred in the 200th positive-working presensitized lithographic printing plate, which caused a stain in print.

What is claimed is:

1. A method for processing both an imagewise exposed, positive-working presensitized lithographic printing plate and an imagewise exposed negative-working presensitized lithographic printing plate, comprising developing the printing plates by repeatedly using a developing solution, comprising a single aqueous, alkaline developing solution capable of developing both an imagewise exposed, positive-working presensitized lithographic printing plate and an imagewise exposed, negative-working presensitized lithographic printing late, the printing plates comprising an aluminum support and a light-sensitive layer formed thereon, a replenishing solution being added to the developing solution to compensate for the degradation of the developing solution brought about by development and/or by carbon dioxide in the air, comprising the steps of;
measuring a reflection density of the light-sensitive layer of the printing plates to discriminate the type of the printing plate,
selecting a predetermined developing condition according to the discriminated type of printing plate, comprising selecting at least one of a transport speed of said plate and an amount of the replenishing solution to be added to the developing solution, and
developing the printing plates according to the selected developing condition.

2. The method of claim 1, wherein said measuring step is carried out by using light having a wavelength of from 350 to 450 nm.

3. The method of claim 1, wherein said measuring step is carried out by using a light having the wavelength of from 550 to 650 nm.

4. The method of claim 1, wherein said measuring step comprises measuring a reflection density of an exposed portion of the light-sensitive layer of said imagewise exposed positive-working presensitized lithographic printing plate.

5. The method of claim 1, wherein said measuring step comprises measuring a reflection density of an unexposed portion of the light-sensitive layer of said imagewise exposed negative-working presensitized lithographic printing plate.

6. The method of claim 1, wherein said positive-working presensitized lithographic printing plate comprises a support and, provided thereon, a light-sensitive layer comprising o-naphthoquinonediazide.

7. The method of claim 1, wherein said negative-working presensitized lithographic printing plate comprises a support and, provided thereon, a light-sensitive layer comprising a diazo resin.

8. The method of claim 1, wherein said developing solution contains an alkali metal silicate and one of an organic solvent and a surfactant, and has a pH of not less than 10.

9. The method of claim 1, wherein said measuring step comprises measuring a reflection density of the surface of the light-sensitive layer at a position within 5 cm from the edge of said printing plate.

10. A method for processing both an imagewise exposed, positive-working presensitized lithographic printing plate comprising an aluminium support and a light-sensitive layer of o-naphthoquinonediazide formed thereon and an imagewise exposed, negative-working presensitized lithographic printing plate comprising an aluminium support and a light-sensitive layer of a diazo resin formed thereon, comprising developing the printing plate with a single developing solution repeatedly used containing an alkali metal silicate, a replenishing solution containing an alkali metal silicate being added to the developing solution to compensate for the degradation of the developing solution brought about by development and/or by carbon dioxide in the air, comprising the steps of;
measuring a reflection density of the light-sensitive layer of the printing plates by using light having a wavelength of from 350 to 450 nm to discriminate the type of the printing plate,
selecting a predetermined developing condition according to the discriminated type of the printing plate, and developing the printing plates according to the selected developing condition.

11. An apparatus for processing both an imagewise exposed, positive-working presensitized lithographic printing plate and an imagewise exposed, negative-working presensitized lithographic printing plate, comprising developing the printing plates by repeatedly using a developer, comprising a single aqueous alkaline solution capable of developing both an imagewise exposed, positive-working presensitized lithographic printing plate and an imagewise exposed, negative-working presensitized lithographic printing plate, the printing plates comprising an aluminum support and a light-sensitive layer formed thereon, comprising;
means for adding a replenishing solution to the developing solution to compensate for the degradation of the developing solution brought about by development and/or by carbon dioxide in the air;
means for measuring a reflection density of the light-sensitive layer of the printing plates;
means for discriminating the type of printing plate,
means for selecting a predetermined developing condition comprising selecting at least one of a transport speed of said plate and an amount of replenishing solution to be added to the developing solution according to the discriminated type of the printing plate, and
means for changing a developing condition of the printing plates automatically according to the selected developing condition.

* * * * *

UNITED STATES PATENT AND TRADEMARK OFFICE
CERTIFICATE OF CORRECTION

PATENT NO. : 5,217,848
DATED : June 08, 1993
INVENTOR(S) : Masafumi Uehara et al.

It is certified that error appears in the above-indentified patent and that said Letters Patent is hereby corrected as shown below:

Claim 1, column 17, line 38, change "late" to --plate--.

Claim 10, column 18, line 26, delete "with" and insert --by repeatedly using--.

Claim 10, column 18, line 27, delete "repeatedly used".

Signed and Sealed this

Thirty-first Day of May, 1994

Attest:

BRUCE LEHMAN

Attesting Officer

Commissioner of Patents and Trademarks